United States Patent
Shih et al.

[11] Patent Number: 6,100,150
[45] Date of Patent: Aug. 8, 2000

[54] PROCESS TO IMPROVE TEMPERATURE UNIFORMITY DURING RTA BY DEPOSITION OF IN SITU POLY ON THE WAFER BACKSIDE

[75] Inventors: Jiaw-Ren Shih; Bi-Ling Lin; Huey-Liang Hwang, all of Hsin-Chu, Taiwan

[73] Assignee: Taiwan Semiconductor Manufacturing Company, Hsin-Chu, Taiwan

[21] Appl. No.: 09/148,563

[22] Filed: Sep. 4, 1998

[51] Int. Cl.[7] ............. H01L 21/336; H01L 21/3205; H01L 21/4763
[52] U.S. Cl. ............. 438/308; 438/592; 438/928
[58] Field of Search .................. 438/476, 928, 438/308, 785

[56] References Cited

U.S. PATENT DOCUMENTS

| | | |
|---|---|---|
| 4,608,096 | 8/1986 | Hill ............................. 148/33 |
| 4,621,413 | 11/1986 | Lowe et al. . |
| 4,853,345 | 8/1989 | Himelick ..................... 437/41 |
| 5,395,770 | 3/1995 | Miki et al. ................... 437/10 |
| 5,496,742 | 3/1996 | Yamada . |
| 5,605,602 | 2/1997 | DeBusk .................... 156/646.1 |
| 5,656,510 | 8/1997 | Chrapacz et al. ........... 438/394 |
| 5,698,891 | 12/1997 | Tomita et al. .............. 257/610 |
| 5,716,873 | 2/1998 | Prall et al. . |
| 5,716,875 | 2/1998 | Jones, Jr. et al. ............ 438/3 |
| 5,739,067 | 4/1998 | DeBusk et al. ............. 438/618 |
| 5,894,037 | 4/1999 | Kikuchi et al. ........... 427/372.2 |

*Primary Examiner*—Richard Booth
*Attorney, Agent, or Firm*—George O. Saile; Stephen B. Ackerman

[57] ABSTRACT

Methods are disclosed for depositing an in situ polysilicon layer on the back of a semiconductor wafer to reduce the temperature at the edge of the wafer during rapid thermal annealing (RTA). The reduced temperature results in decreased boron penetration at the edge of the wafer and a more uniform silicide resistance and threshold voltage across the wafer.

12 Claims, 12 Drawing Sheets

PROCESS TO IMPROVE TEMPERATURE UNIFORMITY DURING RTA BY DEPOSITION OF IN SITU POLY ON THE WAFER BACKSIDE

BACKGROUND OF THE INVENTION

1. Field of the Invention

The invention relates to semiconductor processing, and more particularly to a method of improving the temperature uniformity from the edge to the center of a wafer during rapid thermal annealing (RTA).

2. Description of the Related Art

During rapid thermal anneal (RTA) temperature uniformity from the edge to the center of a semiconductor wafer is a concern especially at high temperatures. In current processes it has been observed that the temperature tends to be higher at the edge of the wafer causing higher boron penetration and higher silicide resistance at the edge. This effect results in a very undesirable spread of the threshold voltage $V_t$ with lower voltages measured at the edge than in the center of the wafer.

A way to improve temperature uniformity is to apply an in situ polysilicon layer to the backside of the wafer. A number of U.S. Patents teach coating of the backside of the wafer to solve a variety of problems.

U.S. Pat. No. 5,716,875 (Jones, Jr. et al.) discloses the use of a hydrogen anneal to reduce dangling atomic bonds at the dielectric/substrate interface of transistors. A silicon nitride layer is then deposited over the transistors and on the backside of the wafer substrate in order to encapsulate the effects of the hydrogen anneal to the CMOS transistors.

U.S. Pat. No. 5,656,510 (Chrapacz et al.) presents a method to provide a backside dielectric layer which protects the semiconductor from electro-static discharge. The backside dielectric layer may be either a nitride or an oxide.

U.S. Pat. No. 5,605,602 (DeBusk) provides a method and device for removing a thin film from a wafer backside. Dopant ions or polysilicon can be deposited upon the exposed backside to enhance extrinsic gettering properties.

U.S. Pat. No. 5,395,770 (Miki et al.) teaches a method of controlling a misfit dislocation by introducing an extrinsic strain on the back surface of the semiconductor substrate and then depositing an epitaxial layer on the semiconductor substrate.

U.S. Pat. No. 4,853,345 (Himelick) describes a process for an n-channel transistor to form a predeposit simultaneously over the polysilicon gate electrode and over the back surface drain region of the chip. This predeposit is followed by a step to form an n-type source region and to make the back surface more conductive U.S. Pat. No. 4,608,096 (Hill) teaches the use of a 0.05 to 2.0 micron thick layer of polysilicon on the backside to improve gettering capabilities.

It should be noted that none of these above-cited U.S. Patents of the related art address correction of the problem of temperature non-uniformity.

SUMMARY OF THE INVENTION

It is an object of the present invention to provide a method of creating a uniform temperature profile across a semiconductor wafer.

Another object of the present invention is to reduce the increased penetration of boron at the edge of the wafer.

A further object of the present invention is to improve the uniformity of the silicide resistance and threshold voltage across the wafer.

These objects have been achieved by the method involving the steps of providing a semiconductor wafer patterned with gate electrode structures covered by a layer of silicon nitride, deposition of in situ polysilicon on both side of the wafer, subsequent etching away of the top polysilicon, spacer etch, source/drain implantation, rapid thermal annealing, and deposition of a metal layer on the top surface of the wafer.

DESCRIPTION OF THE PREFERRED EMBODIMENT

Using FIGS. 1 through 6 we begin a description of the preferred method of the invention of providing a more uniform temperature for a semiconductor wafer during rapid thermal annealing (RTA), which comprises the following steps.

Figure 1:
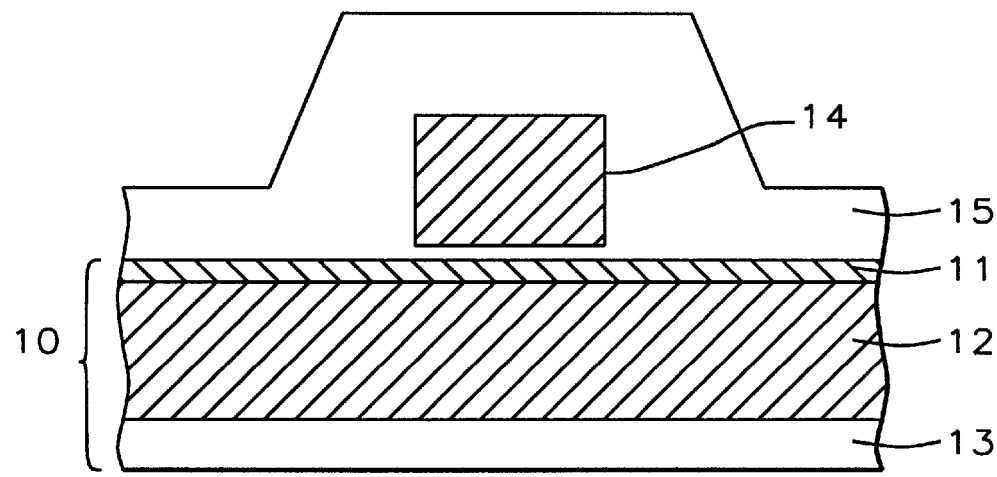
FIG. 1 is step of the present invention showing schematically a cross-section of a semiconductor substrate with a gate electrode structure on top of it and covered by a silicon nitride layer.

Referring now to FIG. 1, a cross-section of a semiconductor wafer 10 is shown. Semiconductor wafer 10 has, starting from its top surface, a p-substrate layer 11, an amorphous silicon layer 12 (Si-Sub) and a silicon nitride layer 13 ($Si_3N_4$). The semiconductor wafer is patterned with gate electrode structures 14 (only one is shown) on the top surface. Wafer and gate electrode structures 15 are then covered by a silicon nitride layer 15 ($Si_3N_4$)

Figure 2:
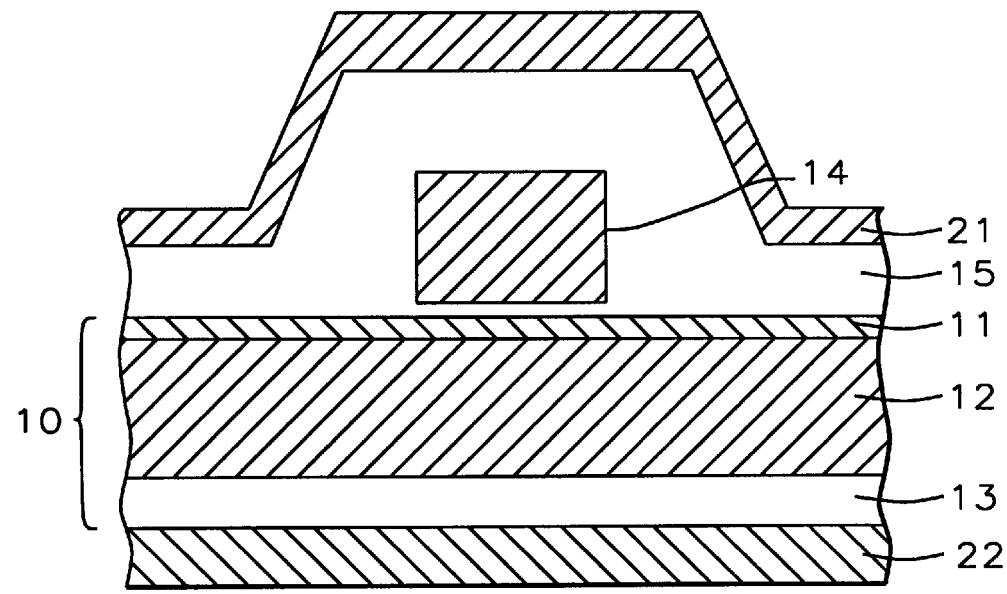
FIG. 2 is the next step of the present invention showing schematically in situ polysilicon deposited on both sides of the wafer.

The next step in the claimed method is depicted in FIG. 2. A first in situ polysilicon layer 21 is deposited on top of silicon nitride layer 15 and a second in situ polysilicon layer 22 is deposited on the bottom surface of wafer 10. Both in situ polysilicon layers 21 and 22 are deposited at the same time using low pressure chemical vapor deposition (LPCVD).

Figure 3:
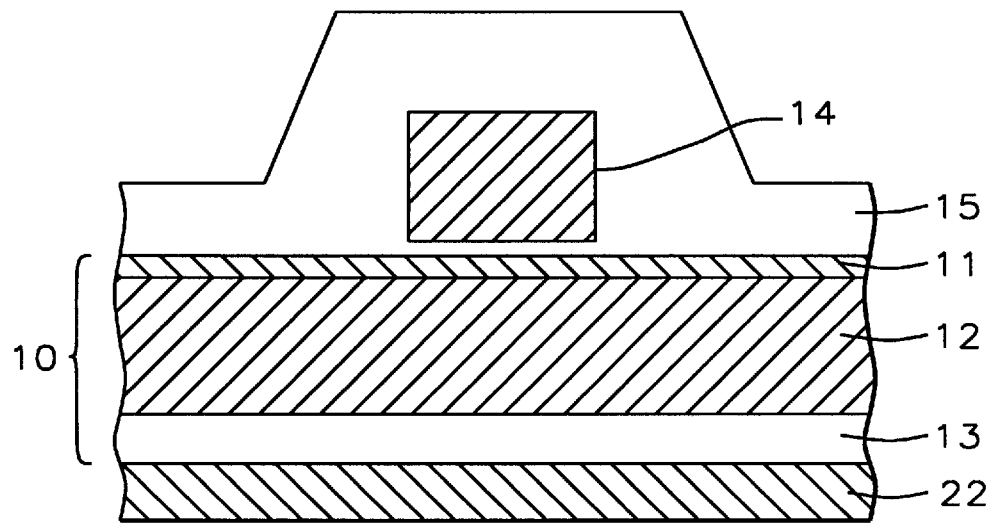
FIG. 3 is the next step of the present invention showing schematically the etch back of the in situ polysilicon from the top surface of the wafer.
Figure 4:
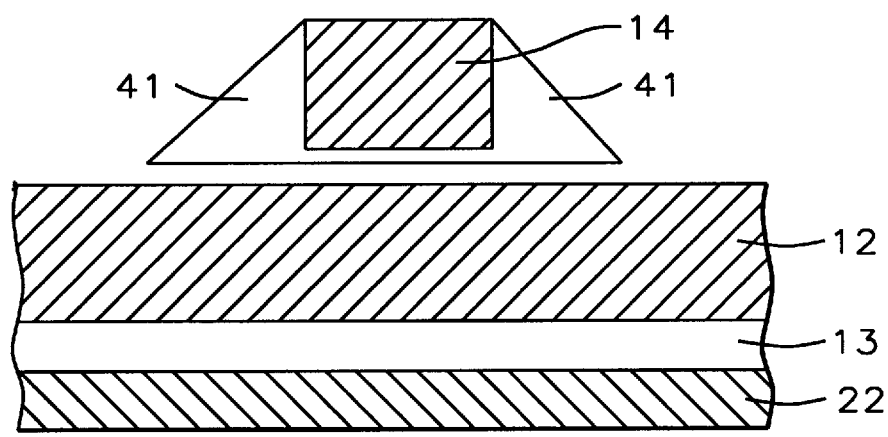
FIG. 4 is the next step of the present invention showing schematically the spacer etch back of the silicon nitride from the gate electrode structure.

In FIG. 3, the first in situ polysilicon layer 21 on the top of wafer 10 is etched back followed by the spacer etch-back step in FIG. 4. Here the silicon nitride layer 15 is etched-back from the gate electrode structure 14 to form spacers 41 bordering each side of the gate electrode structure.

In the next step (see FIG. 5) source and drain regions (not shown) adjacent to each side of gate electrode structures 14 are ion implanted with e.g. boron, or other Type III material. The implanting is indicated symbolically through arrows 51.

In the last step of the preferred method the wafer is first subjected to rapid temperature annealing (RTA), and then a metal layer 61 is deposited on top of the top surface and the gate electrode structures for subsequent silicidation. The wafer 10 (incorporating in situ polysilicon 22) is supported during the anneal step by a RTA Z.Q. Holder 62.

The first in situ polysilicon layer 21 has a thickness of typically 2000 Å, but the thickness can range from 1000 Å to 3000 Å. The second in situ polysilicon layer 22 has a typical thickness of 2000 Å, which, however, may range from 1000 Å to 3000 Å. The second in situ polysilicon layer 22 is deposited on the backside (the bottom surface) of wafer 10 on top of the second silicon nitride layer 13. The purpose of the second in situ polysilicon layer 22 is to reduce the temperature at the perimeter of wafer 10 during RTA, thus achieving greater temperature uniformity across the wafer. The mechanism is unknown by which the in situ polysilicon layer on the back of the wafer reduces the temperature at the edge of the wafer during RTA.

Figure 7:
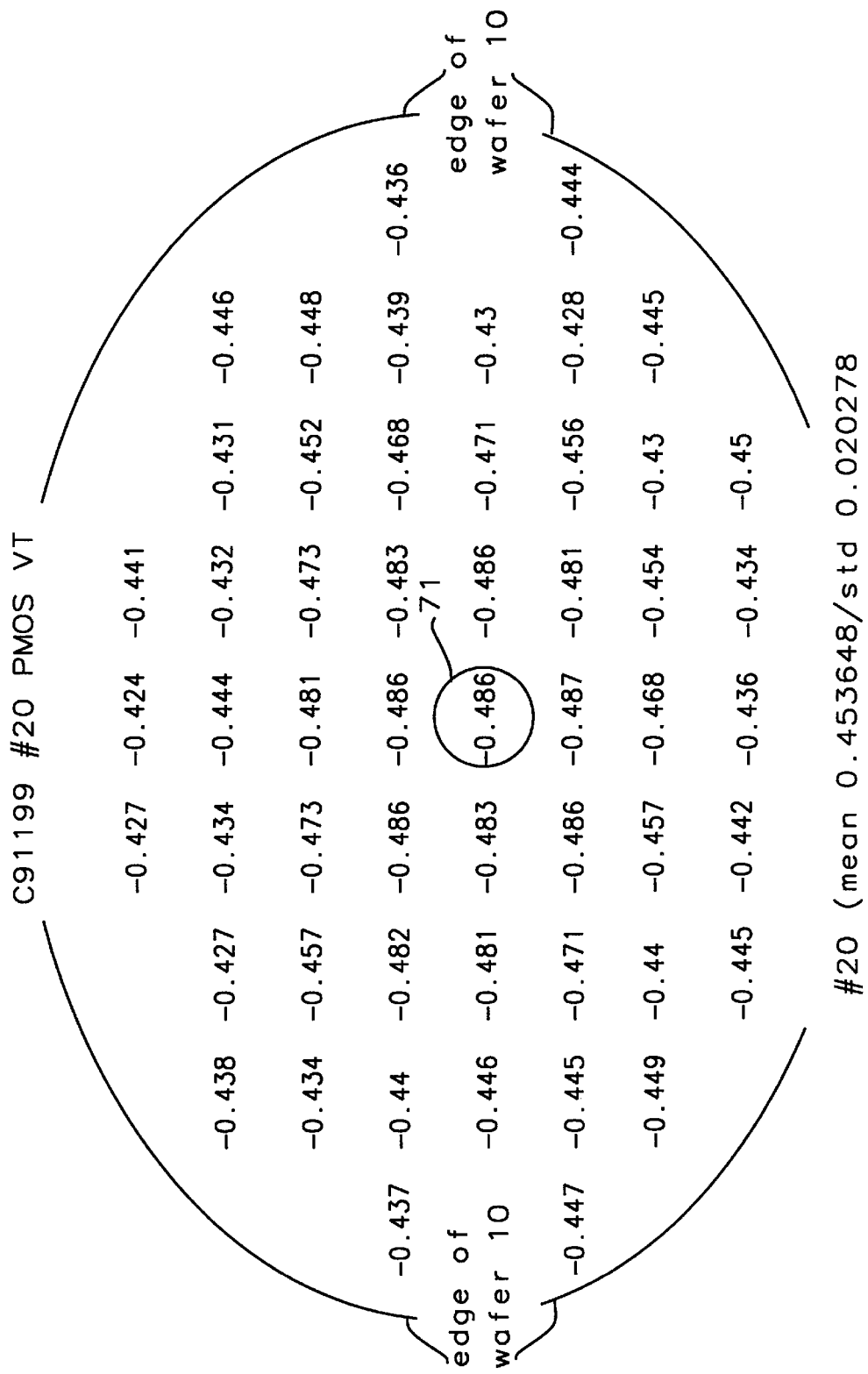
FIG. 7 shows threshold voltage measurements across a wafer without backside in situ polysilicon.

By reducing the temperature at the perimeter of wafer 10 during RTA the boron penetration at the wafer's edge is also reduced, which in turn reduces the silicide resistance in a later process which is not described here. FIG. 7 illustrates the threshold voltages $V_t$ measured on test wafer #20 (Lot ID C91199) of the prior art, where circle 71 in the middle of FIG. 7 indicates the center of the wafer. It can be clearly seen that $V_t$ gradually drops from the center to the edge of the wafer and illustrates the problem. The mean of $V_t$ is 0.453648 volt and the standard deviation (Std) is 0.020278 volt.

Figure 8:
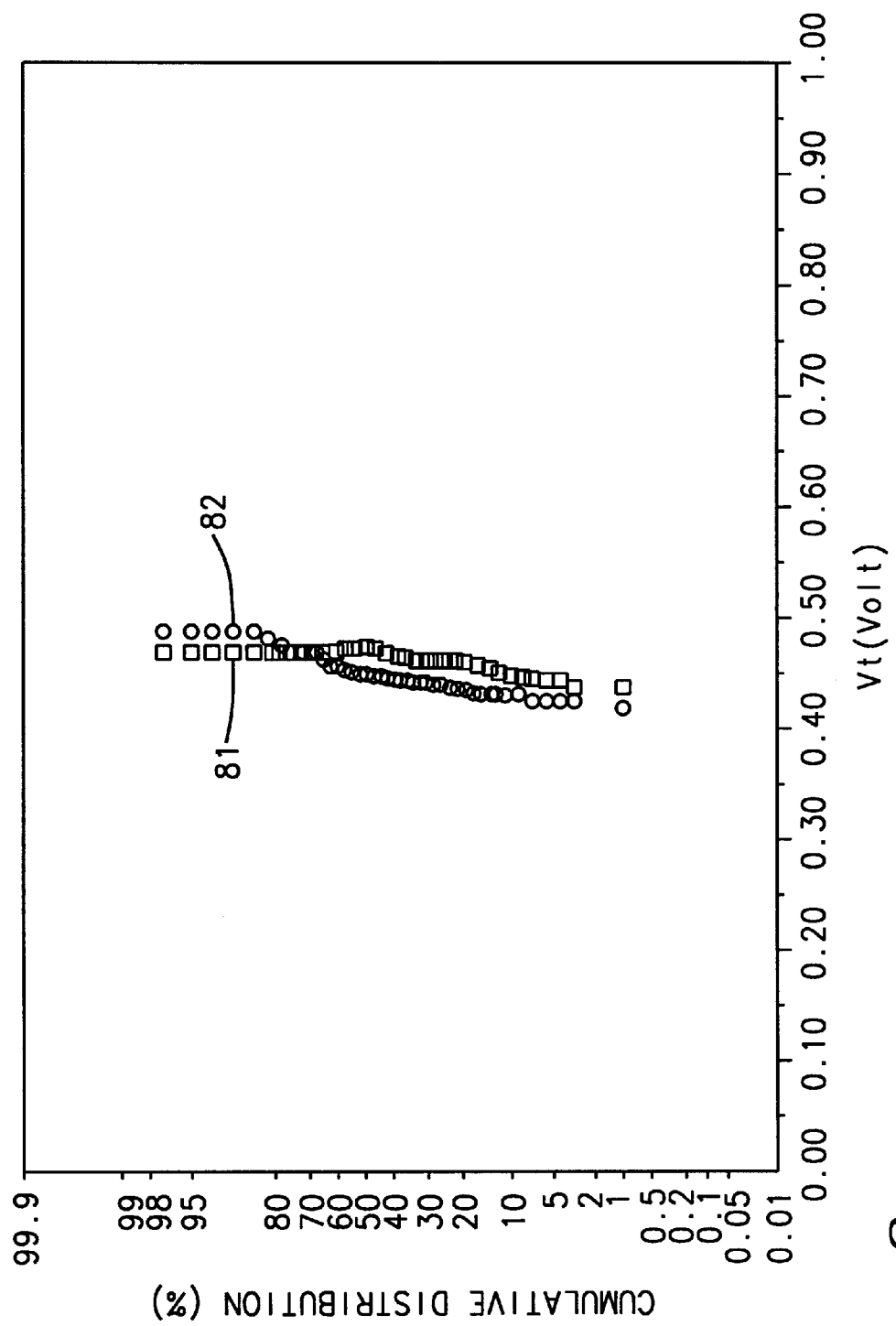
FIG. 8 is a graph relating threshold voltage against cumulative distribution of a wafer without backside in situ polysilicon and of a wafer with backside in situ polysilicon representing the method of the present invention.

FIG. 8 is a graph of the cumulative distribution versus $V_t$ of wafer #20 of FIG. 7, and of a wafer #18. Curve 81 indicates wafer #18 and Curve 82 indicates wafer #20, (both of Lot ID C91199, Die No. 54). Wafer #18 is processed using the method of the invention; it has a mean $V_t$ of 0.458778 volt and a Std of 0.008613 volt. Clearly the standard deviation of wafer #18 is much smaller than the Std of wafer #20, testifying to the effectiveness of the method of the invention.

Figure 9:
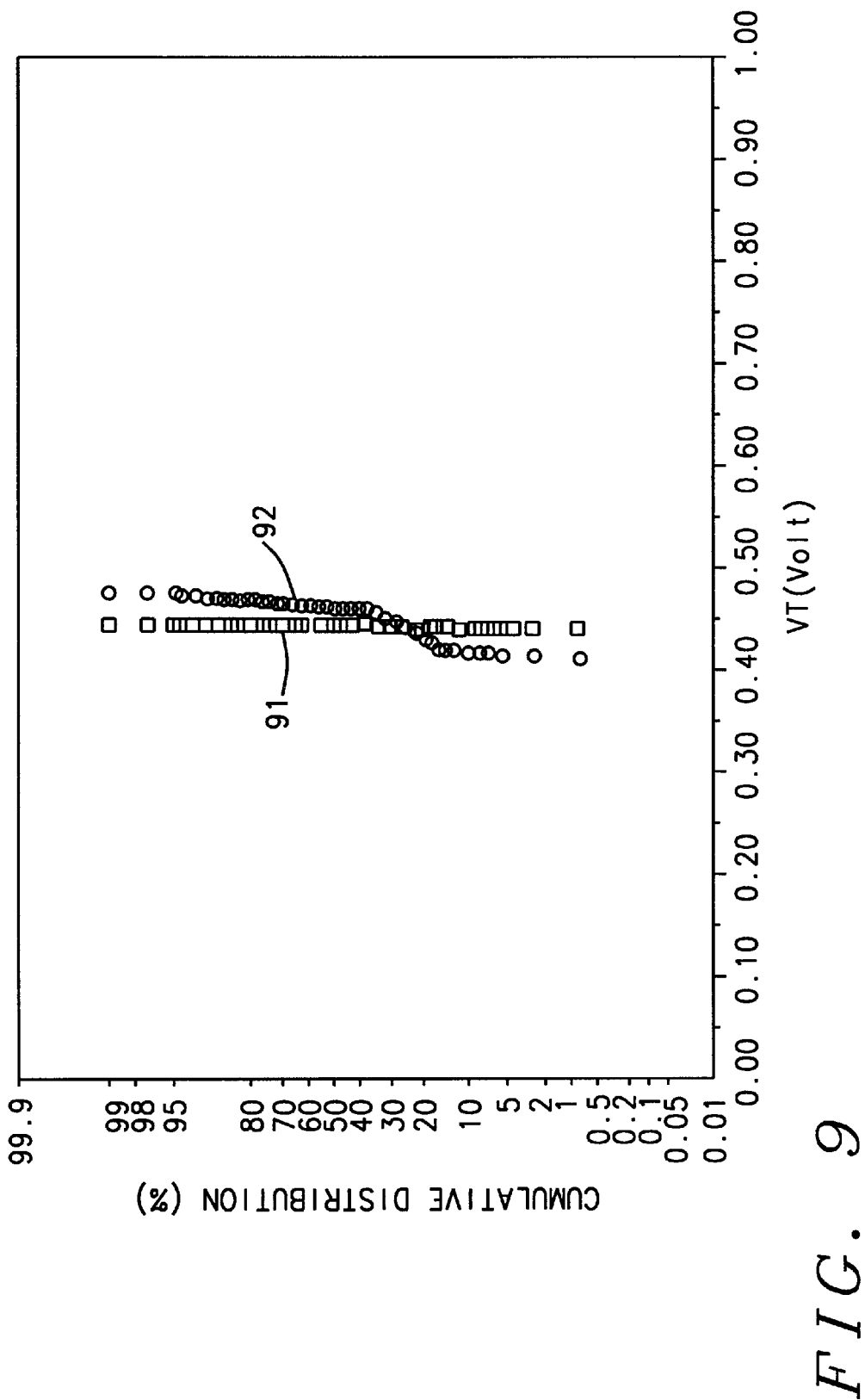
FIG. 9 is a another graph relating threshold voltage against cumulative distribution of a wafer without backside in situ polysilicon and of a wafer with backside in situ polysilicon representing the method of the present invention.

FIG. 9 is a graph of the cumulative distribution versus Vt of wafer #14 (Lot ID D90757, Die No. 53), using the methods of the invention, and of wafer #16, using a traditional process. Curve 91 (squares) indicates wafer #14, having a mean Vt of 0.438019 and a Std of 0.001587 volt. Curve 92 (circles) indicates wafer #16, having a mean $V_t$ of 0.446925 volt and a Std of 0.014945 volt. VTN in FIG. 9 stands for Threshold Voltage of an NMOS transistor and VTP stands for Threshold Voltage of a PMOS transistor.

Figure 10:
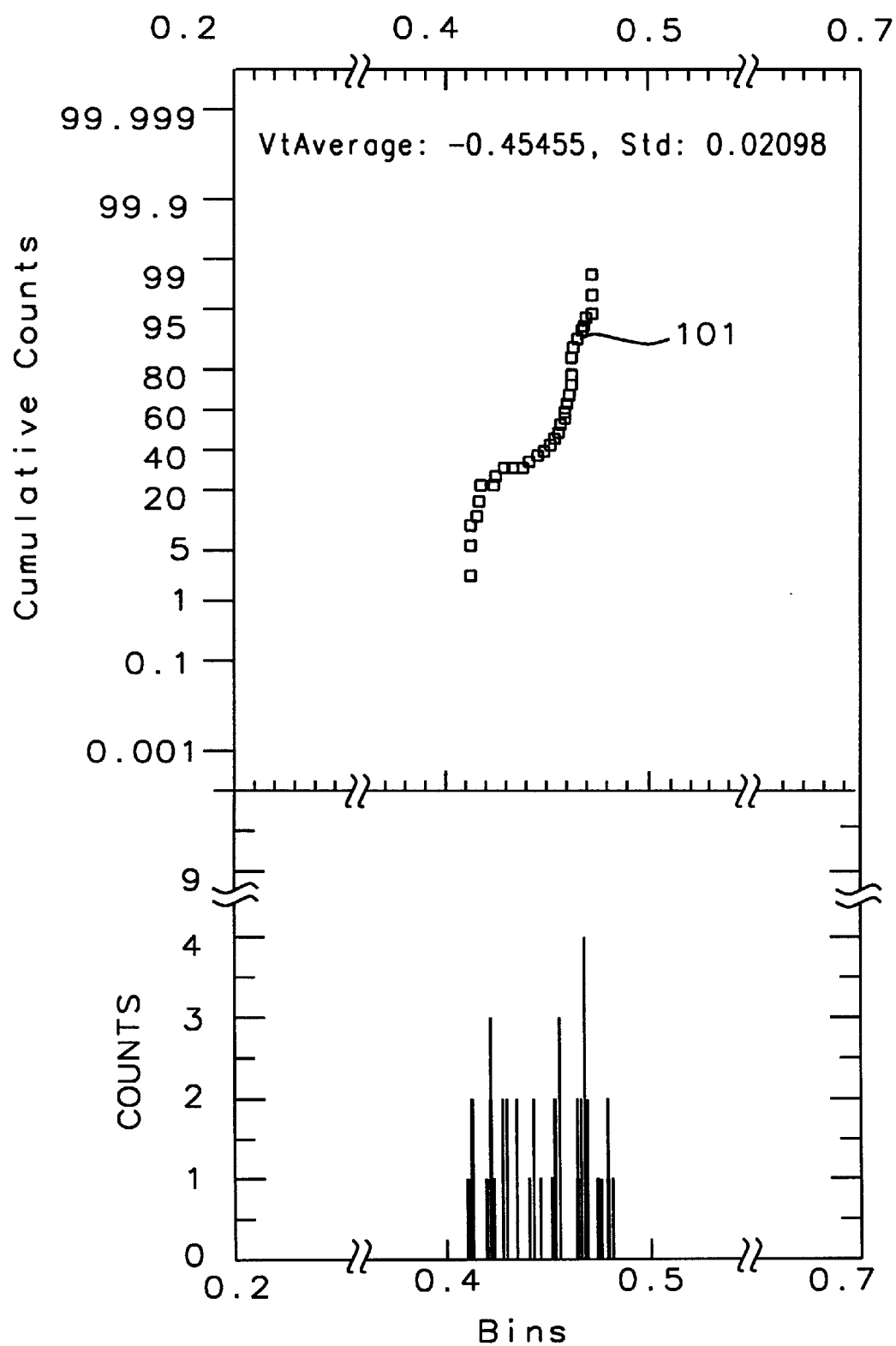
FIGS. 10–12 show cumulative counts and frequency distribution (Counts) vs. $V_t$ for three wafers without backside in situ polysilicon.
Figure 11:
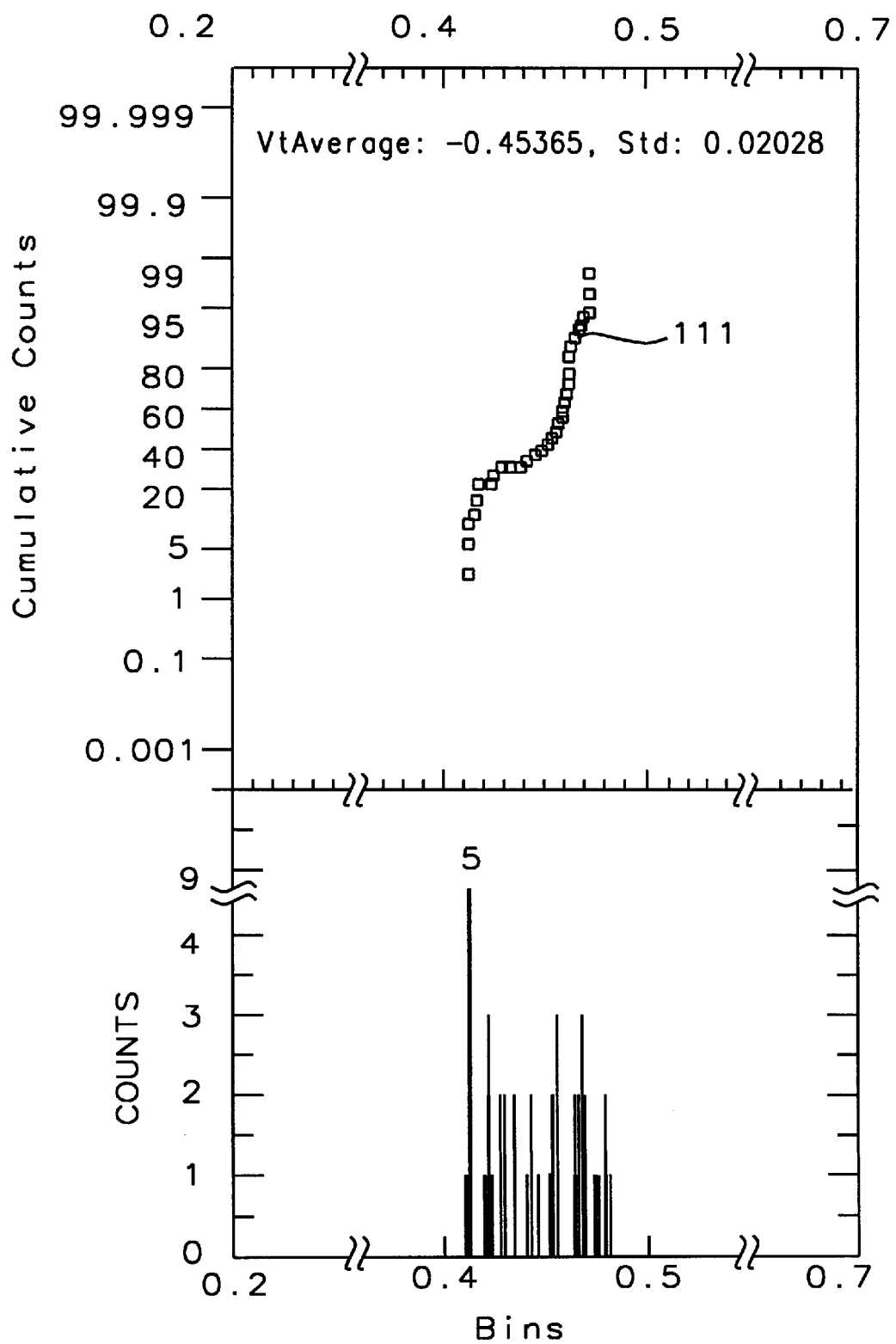
Figure 12:
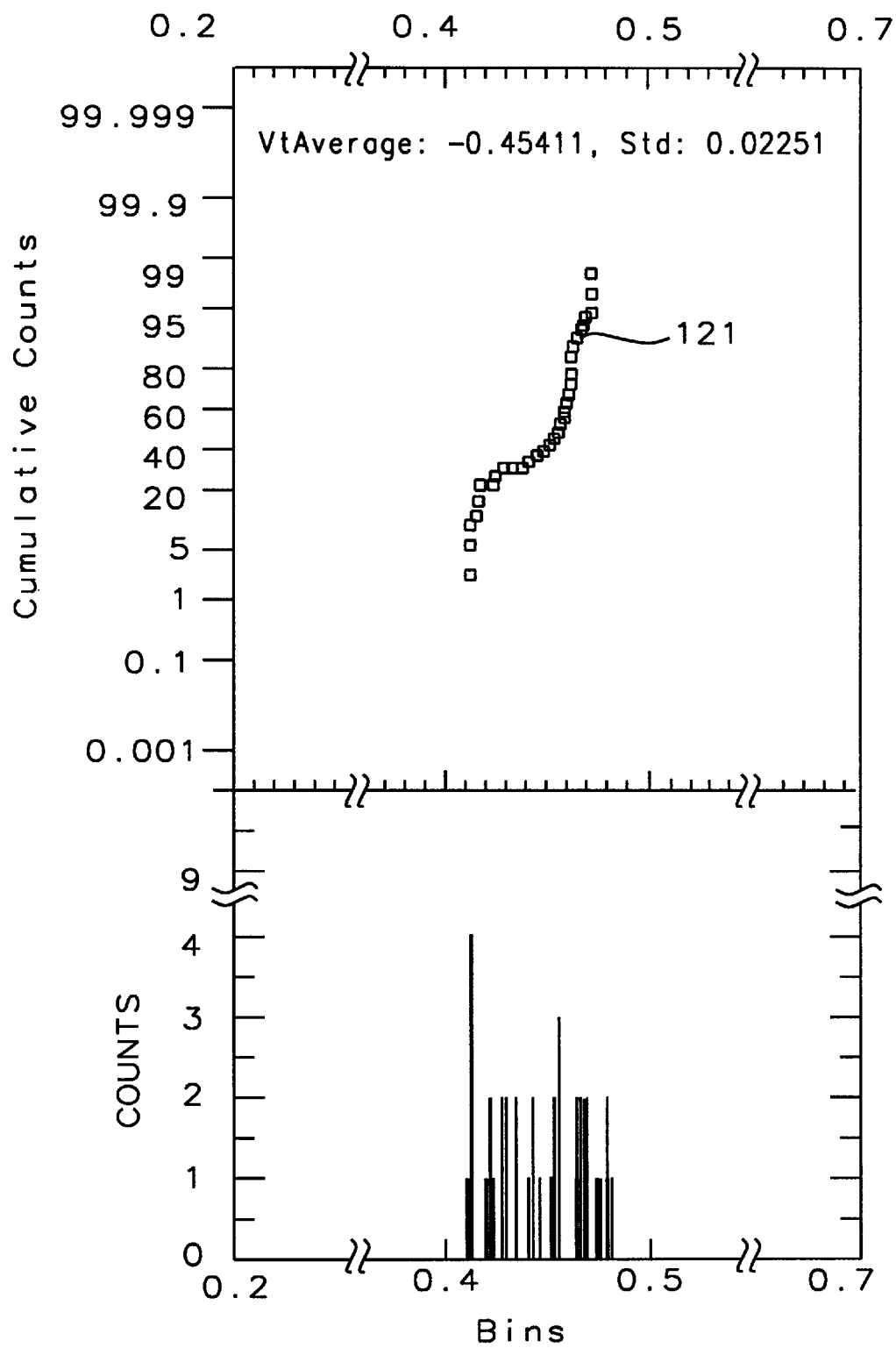

We next discuss FIGS. 10, 11, and 12 which display results of wafers processed without backside in situ polysilicon. Each of these figures shows a graph of Cumulative Counts vs. $V_t$ on the top and a histogram of Counts (frequency of occurrence) vs. $V_t$ in classes (Bins) on the bottom.

Curve 101 of FIG. 10 indicates the cumulative distribution (in %) of the threshold voltage $V_t$ of wafer #20 (Lot ID C91199, Die No. 54), where $V_t$ average is 0.45455 volt and where the Std is 0.02098 volt. The histogram below Curve 101 shows a highest count of 4.

Curve 111 of FIG. 11 indicates the cumulative distribution (in %) of the threshold voltage $V_t$ of wafer #21 (Lot ID C91199, Die No. 54), where $V_t$ average is 0.45365 volt and where the Std is 0.02028 volt. The histogram below Curve 111 shows a highest count of 5.

Curve 121 of FIG. 12 indicates the cumulative distribution (in %) of the threshold voltage $V_t$ of wafer #22 (Lot ID C91199, Die No. 54), where $V_t$ average is 0.45411 volt and where the Std is 0.02251 volt. The histogram below Curve 121 shows a highest count of 4.

Figure 13:
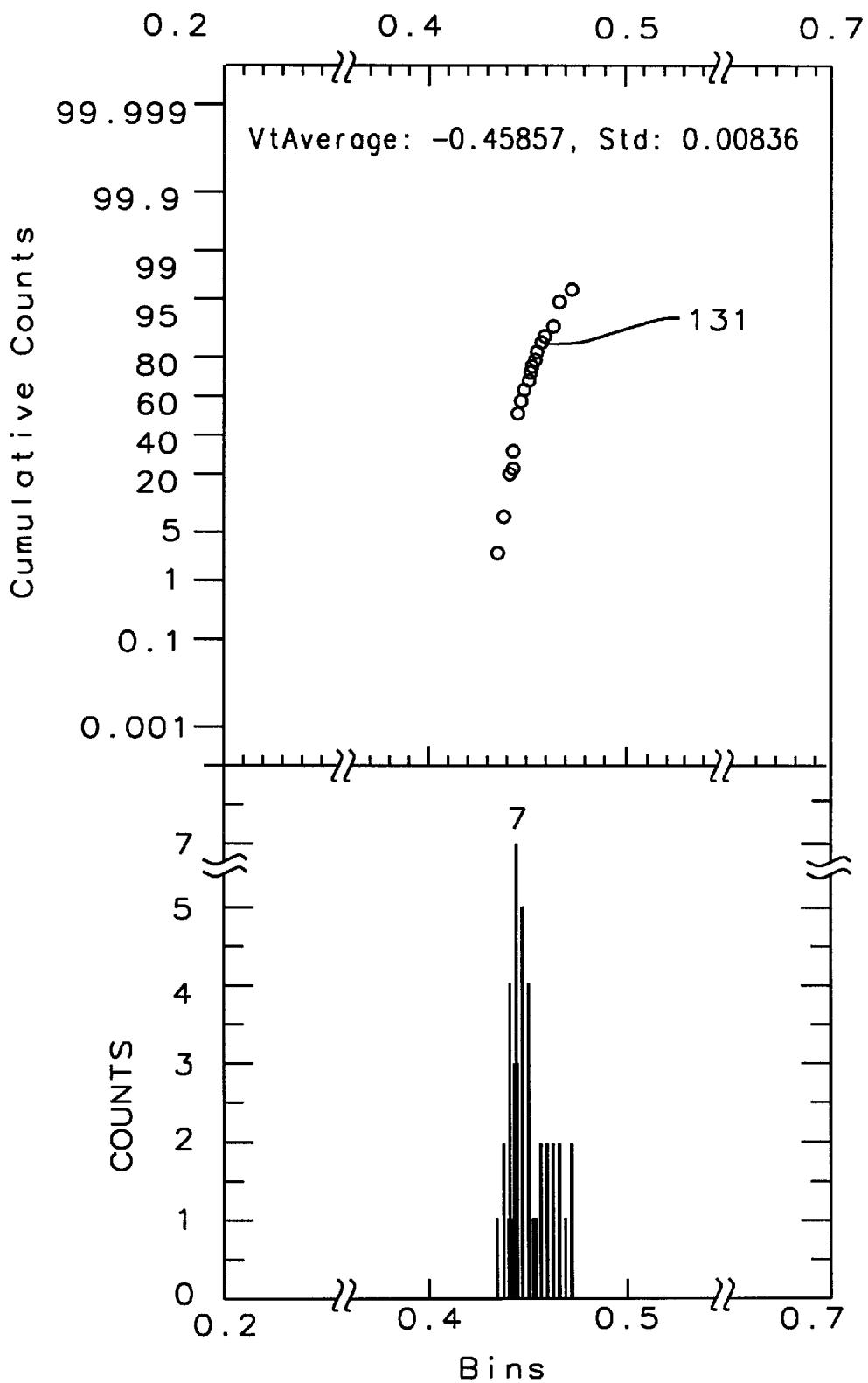
FIGS. 13–15 show cumulative counts and frequency distribution (Counts) vs. $V_t$ for three wafers with backside in situ polysilicon representing the present invention.
Figure 14:
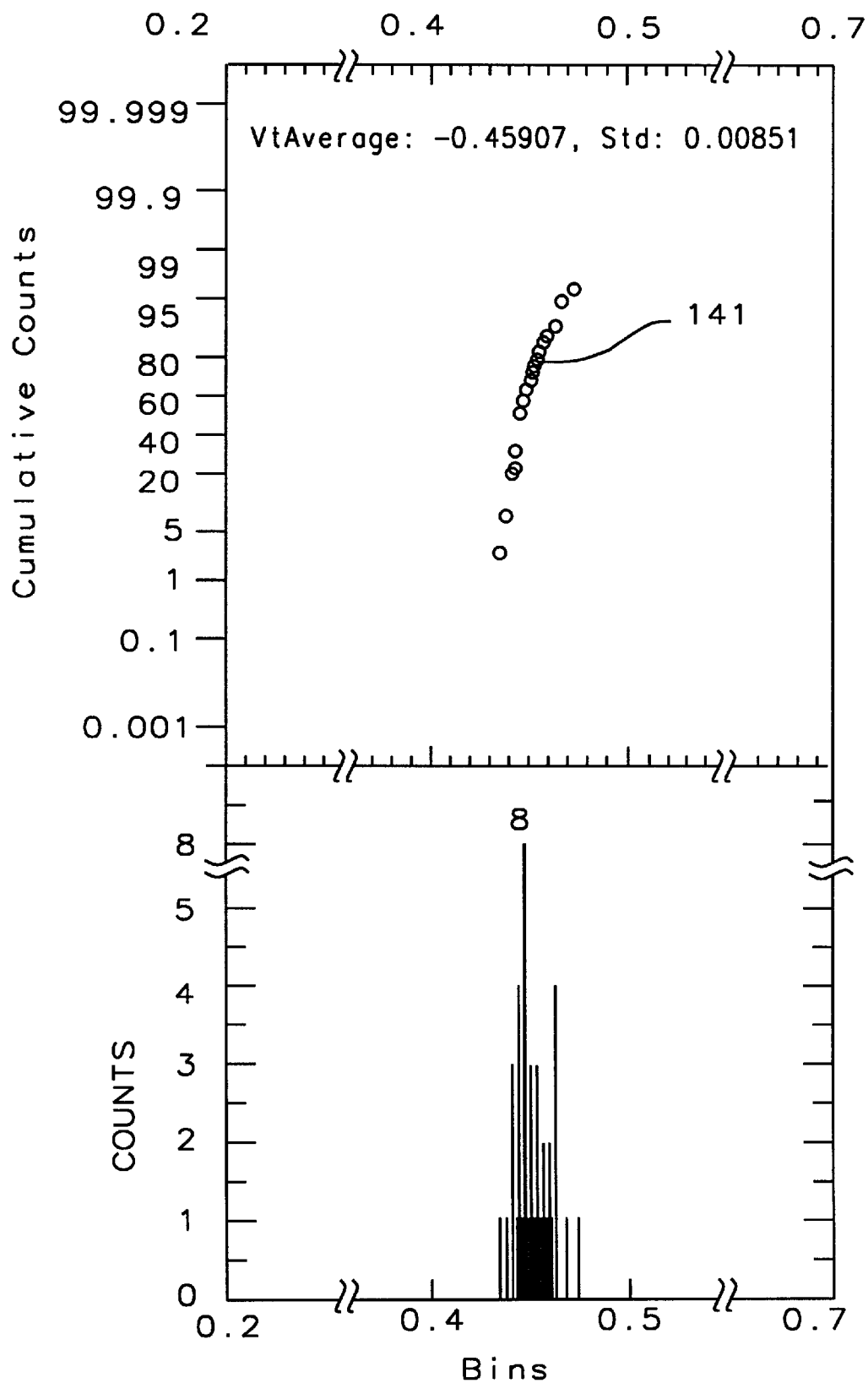
Figure 15:
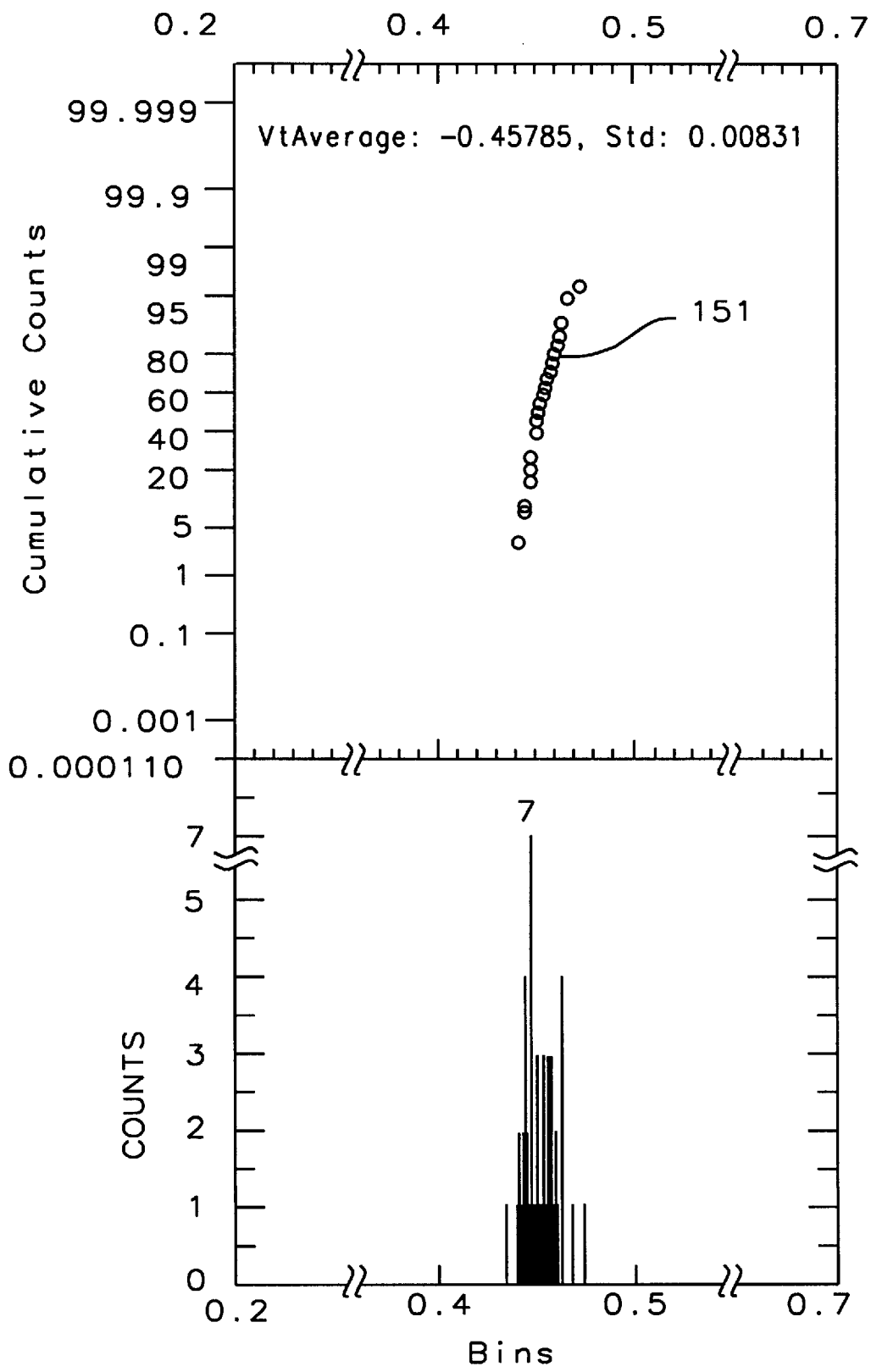

We now discuss FIGS. 13, 14, and 15 which display results of wafers processed with backside in situ polysilicon according to the method of the present invention. Each of these figures shows a graph of Cumulative Counts vs. $V_t$ on the top and a histogram of Counts (frequency of occurrence) vs. $V_t$ classes (Bins) on the bottom.

Curve 131 of FIG. 13 indicates the cumulative distribution (in %) of the threshold voltage $V_t$ of wafer #17 (Lot ID C91199, Die No. 54), where Vt average is 0.45857 volt and where the Std is 0.00836 volt. The histogram below Curve 131 shows a highest count of 7. Note that the standard deviation is much smaller than in wafers without in situ polysilicon on the back and that the values for $V_t$ are densely clustered with a prominent peak around count 7.

Curve 141 of FIG. 14 indicates the cumulative distribution (in %) of the threshold voltage $V_t$ of wafer #18 (Lot ID C91199, Die No. 54), where $V_t$ average is 0.45907 volt and where the Std is 0.00851 volt. The histogram below Curve 141 shows a highest count of 8. Note that the standard deviation is much smaller than in wafers without in situ polysilicon on the back and that the values for $V_t$ are densely clustered with a pronounced peak around count 8. Note that $V_t$ and Std for wafer #18 are also given in FIG. 8, Curve 81. The slight differences in values are caused by variations in the gate oxide thickness.

Curve 151 of FIG. 15 indicates the cumulative distribution (in %) of the threshold voltage $V_t$ of wafer #19 (Lot ID $C_{91199}$, Die No. 54), where $V_t$ average is 0.45785 volt and where the Std is 0.00831 volt. The histogram below Curve 151 shows a highest count of 7. Note that the standard deviation is much smaller than in wafers without in situ polysilicon on the back and that the values for $V_t$ are densely clustered with a pronounced peak around count 7.

Note that the standard deviation of the threshold voltage $V_t$ of devices on semiconductor wafers using the method of the invention, i.e. having an in situ polysilicon layer on the bottom surface, is less than 9 millivolt for all wafers.

In another preferred method of providing a more uniform temperature for a semiconductor wafer during rapid thermal anneal, in situ polysilicon layer 21 is omitted from the top surface of wafer 10 and only in situ polysilicon layer 22 is applied to the back surface of wafer 10; refer to FIG. 2.

Figure 5:
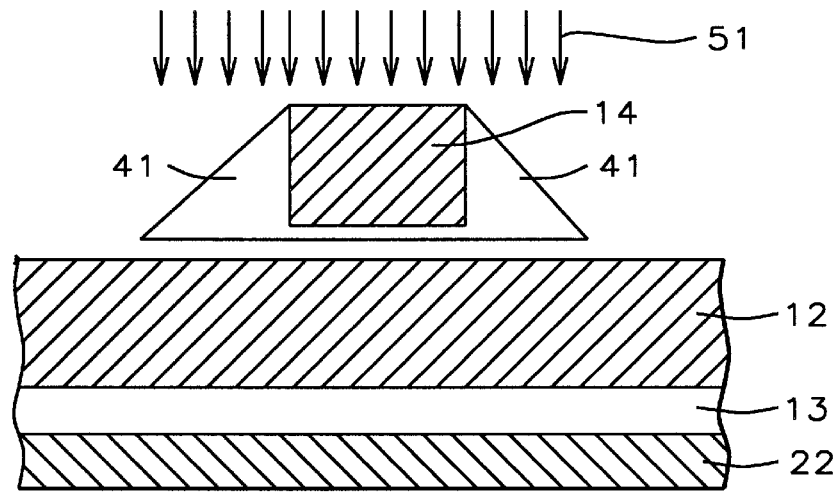
FIG. 5 is the next step of the present invention showing schematically the ion implanting of the source/drain on either side of the gate electrode structure.
Figure 6:
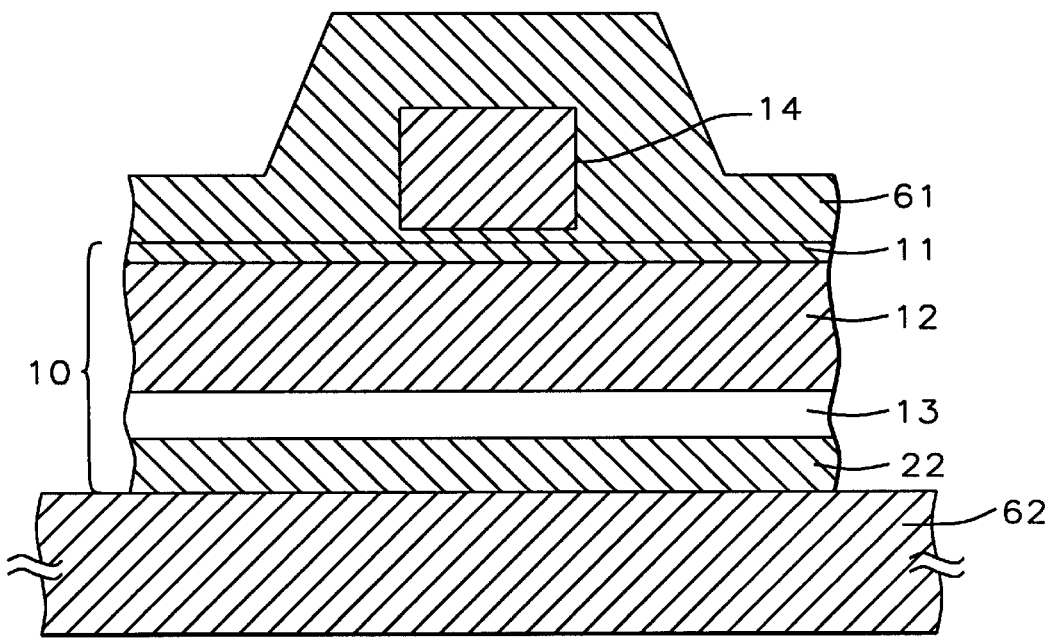
FIG. 6 is the next step of the present invention showing the rapid thermal annealing and subsequent deposition of silicon oxide layer on top of the wafer and gate electrode structure.

Unchanged are the other steps of:

a) providing a semiconductor wafer 10, having a top surface, a bottom surface, where semiconductor wafer 10 is patterned with gate electrode structures 14 on the top surface, see FIG. 1;

b) depositing a first silicon nitride layer 15 on the top surface of wafer 10 and gate electrode structures 14, see FIG. 1;

c) depositing an in situ polysilicon layer 22 on the bottom surface of wafer 10, as discussed above;

d) etching back silicon nitride layer 15, creating spacers 41 bordering both sides of each of gate electrode structures 14, see FIG. 4;

e) implanting source and drain regions (not shown) adjacent to each side of gate electrode structures 14 with e.g. boron, or other Type III materials, as indicated by arrows 51, see FIG. 5;

f) subjecting semiconductor wafer 10 to rapid temperature annealing (RTA), see FIG. 6; and g) depositing a metal layer 61 on top of the surface of wafer 10 and gate electrode structures, see FIG. 6.

In a similar manner wafer 10 has initially the following layers, starting from the top surface, see FIG. 1:

a p-substrate layer 11;

an amorphous silicon layer 12, also called $\alpha$-Si; and a second silicon nitride layer 13 ($Si_3N_4$).

The in situ polysilicon layer 22 has a typical thickness of 2000 Å, which, however, may range from 1000 Å to 2000 Å.

Advantages of depositing a layer of in situ polysilicon on the backside of a semiconductor wafer lie in reducing the temperature at the edge of the wafer, in the reduced boron penetration, the resultant reduced silicide resistance, and most importantly in a much narrower distribution of threshold voltages across the wafer.

While the invention has been particularly shown and described with reference to the preferred embodiments thereof, it will be understood by those skilled in the art that various changes in form and details may be made without departing from the spirit and scope of the invention.

What is claimed is:

1. A method of providing a more uniform temperature for a semiconductor wafer during processing, comprising the steps of:

providing said semiconductor wafer, having a top surface, a bottom surface, said semiconductor wafer patterned with gate electrode structures on said top surface;

depositing a first silicon nitride layer on said top surface and said gate electrode structures;

depositing a first in situ polysilicon layer on top of said silicon nitride layer;

depositing a second in situ polysilicon layer on said bottom surface;

etching back said first in situ polysilicon layer;

etching back said first silicon nitride layer, creating spacers bordering both sides of each of said gate electrode structures;

implanting source and drain regions adjacent to each side of said gate electrode structure;

subjecting said semiconductor wafer to rapid temperature annealing (RTA); and depositing a metal layer on top of said top surface and said gate electrode structures.

2. The method of claim 1, wherein said semiconductor wafer further comprises starting from said top surface:

a p-substrate layer;

a silicon layer; and a second silicon nitride layer.

3. The method of claim 1, wherein said first polysilicon layer and said second polysilicon layer are deposited using chemical vapor deposition (CVD).

4. The method of claim 3, wherein said CVD is the low pressure (LP) type.

5. The method of claim 1, wherein said first polysilicon layer has a thickness ranging from 1000 Å to 3000 Å.

6. The method of claim 1, wherein said second polysilicon layer has a thickness ranging from 1000 Å to 3000 Å.

7. The method of claim 2, wherein said second polysilicon layer is deposited on top of said second silicon nitride layer.

8. The method of claim 1, wherein said bottom surface of said semiconductor wafer is supported by an RTA Z.Q. holder during rapid thermal annealing.

9. A method of providing a more uniform temperature for a semiconductor wafer during rapid thermal anneal, comprising the steps of:

providing said semiconductor wafer, having a top surface, a bottom surface, said semiconductor wafer patterned with gate electrode structures on said top surface;

depositing a first silicon nitride layer on said top surface and said gate electrode structures;

depositing an in situ polysilicon layer on said bottom surface;

etching back said silicon nitride layer, creating spacers bordering both sides of each of said gate electrode structures;

implanting source and drain regions adjacent to each side of said gate electrode structure;

subjecting said semiconductor wafer to rapid temperature annealing (RTA); and depositing a metal layer on top of said top surface and said gate electrode structures.

10. The method of claim 9, wherein said semiconductor wafer further comprises starting from said top surface:

a p-substrate layer;

a silicon layer; and a second silicon nitride layer.

11. The method of claim 10, wherein said in situ polysilicon layer is deposited on top of said second silicon nitride layer.

12. The method of claim 9, wherein said in situ polysilicon layer has a thickness ranging from 1000 Å to 2000 Å.

* * * * *